(12) United States Patent
Knoedgen et al.

(10) Patent No.: US 9,958,487 B2
(45) Date of Patent: May 1, 2018

(54) METHOD AND APPARATUS FOR POWERING AN ELECTRONIC DEVICE

(71) Applicants: Dialog Semiconductor (UK) Limited, London (GB); Dialog Semiconductor Inc., Campbell, CA (US)

(72) Inventors: Horst Knoedgen, Munich (DE); Andrey Malinin, Fort Collins, CO (US); Klaus Strohmayer, Graz (AT)

(73) Assignees: Dialog Semiconductor (UK) Limited, London (GB); Dialog Semiconductor Inc., Campbell, CA (US)

( * ) Notice: Subject to any disclaimer, the term of this patent is extended or adjusted under 35 U.S.C. 154(b) by 86 days.

(21) Appl. No.: 15/015,357

(22) Filed: Feb. 4, 2016

(65) Prior Publication Data
US 2017/0227587 A1    Aug. 10, 2017

(51) Int. Cl.
| | |
|---|---|
| G01R 31/02 | (2006.01) |
| G01R 27/08 | (2006.01) |
| G01R 27/16 | (2006.01) |
| H02J 7/00 | (2006.01) |

(52) U.S. Cl.
CPC ........... G01R 27/16 (2013.01); G01R 31/021 (2013.01); H02J 7/0029 (2013.01); H02J 2007/0062 (2013.01)

(58) Field of Classification Search
CPC ........ G01R 27/02; G01R 27/16; G01R 27/26; G01R 31/021
USPC .................................................. 324/539, 713
See application file for complete search history.

(56) References Cited

U.S. PATENT DOCUMENTS

| | | | | |
|---|---|---|---|---|
| 3,825,825 A | * | 7/1974 | Smolka ................... | H03J 3/185 324/649 |
| 4,229,626 A | * | 10/1980 | Peoples .................... | H04B 3/46 324/520 |
| 2015/0253370 A1 | * | 9/2015 | Fantoni .................. | G01R 31/11 702/58 |

(Continued)

FOREIGN PATENT DOCUMENTS

DE     197 56 100     10/1998

OTHER PUBLICATIONS

German Office Action, File No. 10 2016 210 185.4, Applicant: Dialog Semiconductor (UK) Limited u.a., dated Feb. 22, 2017, 10 pgs, and English language translation, 6 pgs.

*Primary Examiner* — Amy He
(74) *Attorney, Agent, or Firm* — Saile Ackerman LLC; Stephen B. Ackerman

(57) ABSTRACT

A method of monitoring a process of powering an electronic device through a cable assembly is proposed. The cable assembly comprises a cable which is connected between a power supply and the electronic device. The method comprises generating a synchronization signal, generating a test signal based on the synchronization signal and applying the test signal to one end of the cable, detecting a response signal at the one end of the cable, the response signal resulting from applying the test signal to the cable assembly, and determining, based on the response signal and the synchronization signal, a first and a second quantity indicative of a real part and an imaginary part of the impedance of the cable assembly, respectively. Further, an apparatus for monitoring a process of powering an electronic device through a cable assembly is proposed.

28 Claims, 9 Drawing Sheets

(56) References Cited

U.S. PATENT DOCUMENTS

2016/0061907 A1\* 3/2016 Koba .................... H01M 10/48
324/430

\* cited by examiner

METHOD AND APPARATUS FOR POWERING AN ELECTRONIC DEVICE

TECHNICAL FIELD

This application relates to a method and apparatus for monitoring a process of powering an electronic device, such as e.g. a process of operating or charging a battery-powered portable device. The method and apparatus are particularly applicable to charging processes of portable devices, such as mobile telephones, PDAs, tablet computers, and notebooks, through pluggable standardized cables, such as USB cables.

BACKGROUND

Methods for powering portable devices through cables are known in the art. For instance, a battery-powered device may be charged by connecting it to a wall-plug adaptor including a power converter through a pluggable (removable) standardized cable, such as a Universal Serial Bus USB cable. A charger circuit in the battery-powered device is responsible for limiting the current delivered over the standardized cable in order to prevent over-heating of connectors and the cable itself. Being standardized, the cable connecting the wall-plug adaptor to the mobile device can be replaced with any other cable the connectors of which seem to conform to the same standard, but which is of lower quality (sub-standard cable). Therefore, the current limit has to be set low enough so that low-quality cables or an increased connector impedance, caused by connector wear over time or dirt caught between the plug and the receptacle, will not present a safety risk during charging. Other safety critical situations may arise if the power pins of two connectors are not properly connected to each other.

In existing solutions, the current limit is based on specifications of the relevant standard, e.g. specifications of the USB standard, and evaluations done by the device manufacturer.

However, such existing solutions do not account for removable cables of low quality, the connectors of which only seem to conform to the given standard (i.e. fit physically into respective receptacles of the mobile device and the wall-plug adaptor), but which themselves do not meet the specifications of the given standard (i.e. substandard cables). Using such removable cables may result in damage to the wall-plug adaptor or the battery-powered device. In the worst case, the wall-plug adapter, the cable, one of the connectors, or the charger circuit within the battery-powered device may be thermally destroyed. Moreover, such existing solutions do not account for an increase of the impedance of a cable caused by dust or by wear and tear. Also, fixedly setting the current limit on the basis of specifications of the relevant standard may not allow charging the battery-powered device with the highest possible current under all circumstances, in particular when taking into account safety margins. Thus, state of the art solutions may not be able to achieve the shortest possible charging time for the battery-powered device.

SUMMARY

There is a need for an apparatus and a method for monitoring a quality of a cable used during a process of powering (e.g. charging) of an electronic device (e.g. a battery-powered device) and for dynamic limiting of the input power during the process of powering depending on the detected quality of the cable. In view of this problem, the present document provides a method of monitoring a process of powering an electronic device and an apparatus for monitoring a process of powering an electronic device.

The present invention addresses an apparatus for monitoring a process of powering an electronic device through a cable assembly. The cable assembly comprises a cable connected between a power supply and said electronic device. The power supply may be wall plug adaptor comprising an AD/DC converter operating for example according to the USB standard. The apparatus comprises a synchronization signal generator, a test signal generator, a filter unit, and an impedance estimation unit. The synchronization signal generator is configured to generate a synchronization signal of a given shape at a predetermined frequency. The test signal generator is configured to generate, based on the synchronization signal, a test signal, e.g. a sinusoidal signal with the predetermined frequency, and to apply the test signal to one end of the cable. The filter unit is configured to detect or filter-out a response signal at the one end of the cable, the response signal resulting from applying the test signal to the cable assembly. Further, the impedance estimation unit is configured to determine, based on the response signal and based on the synchronization signal, a first quantity indicative of a real part of an impedance of the cable assembly and a second quantity indicative of an imaginary part of the impedance of the cable assembly.

The described apparatus makes it possible to estimate both the real part and the imaginary part of the complex impedance of the cable assembly. A complex impedance provides additional information about the cable assembly compared to previous solutions which only measure the absolute value of the complex impedance. For example, the length of the cable may be deduced from the value of the imaginary part of the complex impedance.

Moreover, the described apparatus shows the advantage that the measurement may be performed during a process of powering/charging the electronic device. In this way, an interruption of the charging process is avoided. In particular with the help of the filter unit it becomes possible to filter out the response signal from noise originating from the charger circuit and other parts of the cable assembly.

The cable may be a pluggable (removable) cable e. g. with standardized connectors at each end of the cable. The cable assembly is understood to relate to all relevant parts of the power delivery path and may include e. g. the connectors of the cable, any printed circuit board (PCB) traces, and the cable itself.

The synchronization signal is a periodic signal which is generated by the synchronization signal generator at the predetermined frequency. The synchronization signal may be e. g. a clock signal which oscillates between a high state and a low state. For example, the high state may correspond to a logical value of +1 whereat the low state may correspond to a logical value of −1. The synchronization signal is used to synchronize the generation of the test signal at the test signal generator with the determination of the first and the second quantity at the impedance estimation unit. In the simplest case, the synchronization signal may be a square wave with a 50% duty cycle. However, more complex waveforms may be used. The synchronization signal may trigger actions at the impedance estimation unit and at the test signal generator at a rising edge, a falling edge or both at the rising edge and falling edge of the synchronization signal.

Using the proposed apparatus for monitoring a process of powering the electronic device, several measurements at different frequencies of the synchronization signal may be carried out. Moreover, the amplitudes of the test signal may be varied in different measurements. By comparing the obtained first and second quantities, an optimal frequency of the synchronization signal and an optimal amplitude of the test signal may be determined for estimating the real part and the imaginary part of the complex impedance. By changing the frequency, a better signal-to-noise ratio can be obtained. For example, a AC/DC converter in the power supply (e.g. a switched power converter in a wall plug adaptor) will produce some special frequency-related-noise (e.g. by the switching operation) and the test signal should be not have the same frequency in order to be clearly separable from the switching noise. Furthermore, the resonance frequency of the cable (which might not be known a prior) should be avoided. Thus, it may be preferable to use different frequencies for the synchronization and test signal and try out which one works best In general, the test signal may be a sinusoidal-shaped signal. The test signal is synchronized with the synchronization signal and has the same predetermined frequency as the synchronization signal. For instance, the positive half-wave of the test signal may be synchronized with the synchronization signal being in the high state and a negative half-wave of the test signal may occur during times when the synchronization signal is in the low state. Typical frequencies of the test signal and the synchronization signal may be e. g. in the range of 1 kHz to 50 kHz. The amplitude of the test signal may be small compared to the DC voltage used to power the electronic device. In addition, it may be very small with respect to the noise of the AC/DC converter (e.g. 0.1% of the noise of the AC/DC converter).

The test signal may be a time-dependent current variation or a time-dependent voltage variation. Nevertheless, the test signal preferably is a time-dependent current variation, which, when applied to one end of the cable, causes a time-dependent voltage variation which is detected as response signal by the filter unit. For generating the test signal, the test signal generator may comprise a controllable current source. Preferably, an amplitude of the time-dependent current variation is chosen such that an amplitude of the time-dependent voltage variation of the response signal is small compared to a DC voltage for powering the electronic device.

The electronic device may be e.g. a mobile phone, a smart phone, personal digital assistant PDA, a tablet PC, a laptop PC, or any other kind of portable or non-portable electronic device. In particular, the electronic device may be chargeable via an USB cable.

The power supply may be e.g. a general-purpose alternating-current electronic power supply, denoted as mains or powerline, with a suitable power converter. For example, the power converter may be adapted to provide a USB compliant power source. Additionally, the power supply may comprise one or more receptacles or connectors to establish an electrical connection with a USB cable.

The impedance estimation unit may further comprise a first switching unit configured to apply, triggered by the synchronization signal, the response signal to an input of a first low pass filter. A second switching unit of the impendence estimation unit may apply, triggered by an inverted version of the synchronization signal, the response signal to an input of a second low pass filter. Both the first and second switching units may be gates implemented e.g. by one or more transistors.

Alternatively, instead of using an inverted synchronization signal, a 180-degree-phase shifted version of the synchronization signal may be used (e.g. by delaying the synchronization signal) as a trigger to control the second switching unit. The impedance estimation unit may further comprise a difference determination unit, which is connected to an output of the first low pass filter and to an output of the second low pass filter. The difference determination unit determines the first quantity by determining a difference of a first signal at the output of the first low pass filter and a second signal at the output of the second low pass filter e.g. the difference in output voltage of the low pass filters.

The inverted version of the synchronization signal may be generated by an inverter. The synchronization signal is then applied to an input of the inverter, the output of the inverter is connected to a control input of the second switching unit, and the inverter is configured to invert the synchronization signal at its input in the inverted version of the synchronization signal. Put in a different way, an input signal of the second switching unit may be in a low state whenever the synchronization signal is in a high state and vice versa. Consequently, the input signal of the second switching unit is always in an opposite state compared to the input signal of the first switching unit.

In case the applied test signal is sinusoidal-shaped, the resulting response signal will be sinusoidal-shaped, too. However, the amplitude and/or phase of the response signal may be different from the amplitude and/or phase of the test signal. The first switching unit may e.g. connect the response signal at its input with the first low pass filter at its output whenever the synchronization signal is in a high state. Hence, the switching behavior of the first switching unit is synchronized with the test signal originally applied to the cable assembly. The signal at the input of the first low pass filter may thus only comprise the portions of the response signal during times corresponding to the positive half-waves of the test signal. At the output of the first low pass filter, a first average voltage is provided which represents an average value of the response signal during times in which the test signal has positive values. In the simplest case, the first low pass filter may comprise a resistor and a capacitor.

On the other hand, the second switching unit may e.g. connect the response signal at its input with the second low pass filter at its output whenever the synchronization signal is in a low state. The signal at the input of the second low pass filter may thus only comprise the portions of the response signal during times corresponding to the negative half-waves of the test signal. At the output of the second low pass filter, a second average voltage is provided which is indicative of an average value of the response signal during times in which the test signal has negative values. The second low pass filter may be implemented by using a resistor and a capacitor.

The resulting first quantity can be seen as an average value of the amplitude of those portions of the response signal which are in phase with the test signal. Therefore, the first quantity is an estimate for the real part of the complex impedance of the cable assembly. To obtain the imaginary part of the complex impedance, the same components and units of the described monitoring apparatus may be used. The second quantity indicative of the imaginary part of the impedance of the cable assembly may be determined by using a shifted synchronization signal. To this and, either the synchronization signal generator or the impedance estimation unit may generate the shifted synchronization signal by shifting a phase of the synchronization signal by 90 degree. The first switching unit is then configured to apply, triggered by the shifted synchronization signal, the response signal to the input of the first low pass filter. On the other hand, the second switching unit applies, triggered by an inverted version of the shifted synchronization signal, the response signal to the input of the second low pass filter. At the same time, the test signal is still in phase i.e. synchronized with the original synchronization signal.

The difference determination unit determines the second quantity by determining a difference between a first signal at the output of the first low pass filter and a second signal at the output of the second low pass filter. In other words, the resulting second quantity can be seen as an average value of the amplitude of those portions of the response signal which are in phase with a 90-degree-phase-shifted version of the test signal. As a result, the second quantity may represent the imaginary part of the complex impedance of the cable assembly.

The filter unit of the apparatus may comprise a band pass filter configured to detect the response signal at the predetermined frequency. In this way, it becomes possible to separate the response signal from disturbances originating from a charger circuit of the electronic device or the power supply and to remove any possible DC components from the response signal.

Additionally or alternatively, the filter unit may comprise a high pass filter with an input capacitor, a feedback resistor, a second resistor, an operational amplifier and a switch. The input capacitor is arranged in between the input of the high pass filter and the non-inverting input of the operational amplifier. The feedback resistor is arranged between the output of the high pass filter and the inverting input of the operational amplifier. A second resistor is arranged in between the inverting input of the operational amplifier and a voltage source, wherein the voltage source provides a reference voltage. The output of the operational amplifier is connected to the output of the high pass filter. A switch is configured to connect the non-inverting input of the operational amplifier with the voltage source. Specifically, the switch may be configured to connect, triggered by the synchronization signal, the non-inverting input of the operational amplifier with the voltage source.

The described arrangement of the high pass filter implements an active high pass filter with a variable time constant. Before starting a measurement of the first quantity and the second quantity, the switch may be shortly opened triggered by a rising edge or a falling edge of the synchronization signal and subsequently be closed again. The input capacitor blocks the high voltage at the input of the high pass filter from the ground related system.

The switch may comprise an n-type and a p-type metal-oxide-semiconductor field-effect transistor MOSFET, wherein a source of the n-type MOSFET is connected with a drain of the p-type MOSFET and a drain of the n-type MOSFET is connected with a source of the p-type MOSFET, and an inverted version of the synchronization signal is applied either to a gate of the p-type MOSFET or to a gate of the n-type MOSFET. Again, for generating the inverted version of the synchronization signal, an inverter circuit may be used. The switch comprising two MOSFETs provides the advantage, that, even when both transistors are turned off and the switch is closed, the leakage current through the two MOSFETs will keep the voltage at the non-inverting input of the operational amplifier at the reference voltage of the voltage source. Therefore, the exemplary switch comprising two MOSFETs may replace a high ohm resistor.

The filter unit may further comprise an alternative band pass filter with an input capacitor, an operational amplifier, a feedback capacitor and three feedback resistors. The input capacitor is arranged between the input of the alternative band pass filter and the inverting input of the operational amplifier. The non-inverting input of the operational amplifier is connected to a voltage source at a reference voltage and the output of the operational amplifier is connected to the output of the alternative band pass filter. The feedback capacitor is arranged between the output of the alternative band pass filter and an intermediate node. A first feedback resistor is arranged between the inverting input of the operational amplifier and the intermediate node, a second feedback resistor is arranged between the non-inverting input of the operational amplifier and the intermediate node, and a third feedback resistor is arranged between the output of the alternative band pass filter and the intermediate node.

The proposed alternative band pass filter makes it possible to substitute a single feedback resistor with high resistance by the three feedback resistors in a T-shaped arrangement, wherein the three feedback resistors may exhibit comparatively low resistance values.

The apparatus may be further configured to generate a signal for adjusting a current in and/or voltage output of the power supply based on the determined first quantity and/or second quantity. The signal may be directly utilized by the apparatus to limit the current and/or voltage output of the power supply. Alternatively, the generated signal may be propagated to the power supply which in turn regulates its current and/or voltage output. By continuously monitoring the impedance of the cable assembly over time, it becomes possible to e.g. determine heating of the cable during a charging cycle of the electronic device.

According to a further aspect, a method of monitoring a process of powering an electronic device through a cable assembly is proposed. The method comprises the steps of generating a synchronization signal at a predetermined frequency, generating a test signal based on the synchronization signal and applying the test signal to one end of the cable, and detecting a response signal at the one end of the cable, wherein the response signal results from applying the test signal to the cable assembly. Further, the method comprises a step of determining, based on the response signal and the synchronization signal, a first quantity indicative of a real part of an impedance of the cable assembly and a second quantity indicative of an imaginary part of the impedance of the cable assembly.

The method may further comprise a step of connecting the response signal to an input of a first low pass filter at times indicated by the synchronization signal and a step of isolating the input of the first low pass filter from the response signal at times indicated by the synchronization signal. The response signal is connected to an input of a second low pass filter at times indicated by an inverted version of the synchronization signal. The other way round, the input of the second low pass filter is isolated from the response signal at times indicated by the inverted version of the synchronization signal. Furthermore, the method may comprise a step of determining the first quantity by determining a difference between a first signal at the output of the first low pass filter and a second signal at the output of the second low pass filter.

Moreover, a shifted synchronization signal may be generated by shifting a phase of the synchronization signal by 90 degree. In this situation, the response signal may be connected to the input of the first low pass filter at times indicated by the shifted synchronization signal and the input of the first low pass filter may be isolated from the response signal at times indicated by the shifted synchronization signal. The method suitable for determining an imaginary part of the complex impedance may further comprise connecting the response signal to the input of the second low pass filter at times indicated by an inverted version of the shifted synchronization signal and isolating the input of the second low pass filter from the response signal at times indicated by the inverted version of the shifted synchronization signal. Finally, the second quantity is obtained by determining a difference between a first signal at the output of the first low pass filter and a second signal at the output of the second low pass filter.

It should be noted that the methods and apparatuses including its preferred embodiments as outlined in the present document may be used stand-alone or in combination with the other methods and apparatuses disclosed in this document. In addition, the features outlined in the context of an apparatus are also applicable to a corresponding method. Furthermore, all aspects of the methods and apparatuses outlined in the present document may be arbitrarily combined. In particular, the features of the claims may be combined with one another in an arbitrary manner.

In the present document, the terms "couple", "coupled", "connect", and "connected" refer to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein FIG. 1 schematically illustrates an apparatus for monitoring a process of powering an electronic device.

DESCRIPTION

In the following paragraphs, reference will be made to an apparatus for monitoring a charging system, which exemplarily embodies a powering system. As already mentioned in the forgoing, the term "charging an electronic device" relates to a situation in which electrical energy is provided to the electronic device and some sort of energy storage on the electronic device (such as e.g. a battery or a supercapacitor) is replenished with the provided electrical energy. On the other hand, the term "powering an electronic device" relates to electronic devices which do not necessarily have an energy storage or to situations in which the electronic device has an energy storage, but this storage is not necessarily charged by the provided energy. The latter situation may occur e.g. when the energy storage is fully charged and the provided energy is directly consumed by the electronic device. The disclosure is not to be understood to be limited to a charging system, or to charging of a battery-powered device, but is to be understood to generally relate to a powering system and to powering a portable device.

Figure 1:
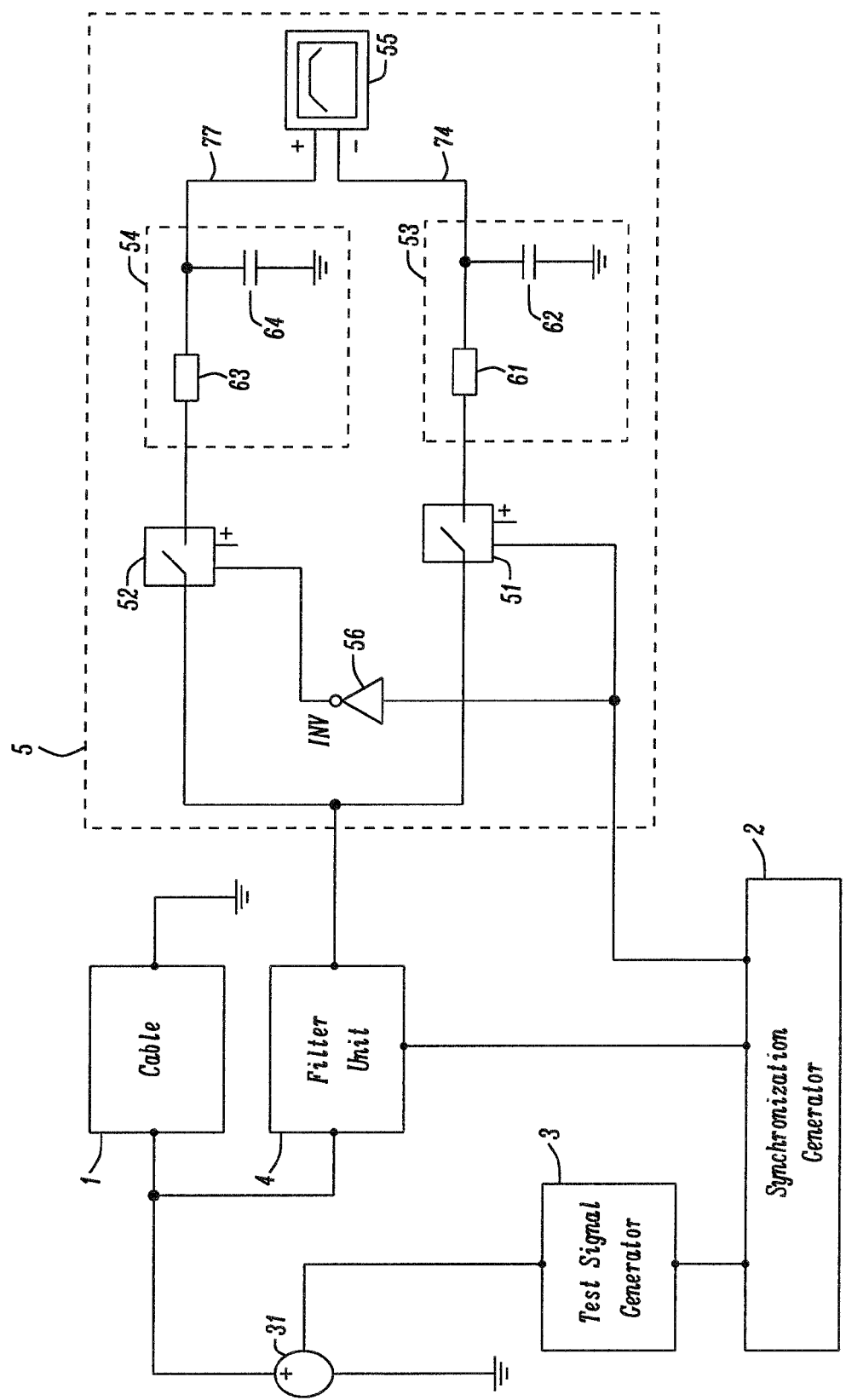

A high-level system block diagram of an apparatus for monitoring a process of charging an electronic device is illustrated in FIG. 1. The electronic device, which is not illustrated in FIG. 1, is charged via a cable 1 which may be e.g. a cable compliant with the USB standard. Specifically, cable 1 may comprise USB compliant connectors at both ends of the cable.

The apparatus for monitoring the charging process comprises: a synchronization signal generator 2, test signal generator 3, a filter unit 4 and an impedance estimation unit 5. The example apparatus depicted in FIG. 1 comprises a current source 31, which is electrically coupled to and controlled by the test signal generator 3. The current source 31 is further connected to one end of cable 1 for stimulating cable 1 with one or more periodic test signals, such as e.g. sinusoidal-shaped test signals. For instance, current source 31 modulates a charging current for charging the electronic device with a sinusoidal-shaped current modulation whose amplitude is small compared to the amplitude of the charging current. The test signals may be generated at one or more predetermined frequencies. Of course, current source 31 may also be part of the test signal generator 3 instead of being external to the latter.

In FIG. 1, filter unit 4 is connected to the same end of cable 1 as current source 31. Filter unit 4 is configured to receive a response signal which results from applying the test signal to the cable assembly including cable 1. Besides cable 1, the cable assembly may include connectors at one or both ends of cable 1 as well as any printed circuit board PCB traces. In addition, the cable assembly may include further conductive components which are electrically coupled to cable 1.

In FIG. 1, neither the electronic device nor a power supply is depicted. The electronic device and the power supply may be located at opposite ends of cable 1 or at the same end of cable 1. In particular, the electronic device may be located at the end of cable 1 at which the current source 31 and the filter unit 4 are located and the power supply may be located at the other end of cable 1. As illustrated in FIG. 1, both ends of cable 1 are ultimately connected to the same absolute ground.

As illustrated in FIG. 1, the operation of the test signal generator 3, the filter unit 4 and the impedance estimation unit 5 are synchronized by the synchronization signal generator 2. For this purpose, the synchronization signal generator is electrically connected and transmitting synchronization signals to the latter components. The synchronization signals may be any kind of clock signals suitable for synchronizing analog and/or digital circuit components.

The filter unit 4 may be a high pass filter or a bandpass filter for detecting the response signal. In any case, DC components should be removed from the response signal. As a consequence, the response signal may be a periodic (e.g. sinusoidal-shaped or square wave) voltage variation which oscillates around a zero voltage level (see e.g. FIG. 2). At this, both phase and amplitude of the response signal may be changed in comparison to the test signal depending on the characteristics of the cable assembly. The amplitude of the response signal may be damped by any resistive components of the cable assembly, whereas any inductive or capacitive components of the cable assembly will cause a phase shift of the response signal relative to the test signal.

Next, the response signal is delivered to the impedance estimation unit 5. The impedance estimation unit 5 is configured to determine, based on both the response signal and the synchronization signal, a first quantity indicative of a real part of an impedance of the cable assembly and a second quantity indicative of an imaginary part of the impedance of the cable assembly. A first branch of the impedance estimation unit 5 comprises a first switching unit 51 and a first low pass filter 53, which comprises a first resistor 61 and a first capacitor 62. In a first step, the response signal is fed to the first switching unit 51 which is controlled by the synchronization signal generated by the synchronization signal generator 2.

In the following description, a square wave oscillating between a high state and a low state with a duty cycle of 50% will be discussed as an exemplary embodiment of a synchronization signal. However, it should be noted that the present disclosure is not limited to this specific clock signal and that other synchronization signals with various states and/or wave forms may be used instead.

Figure 2:
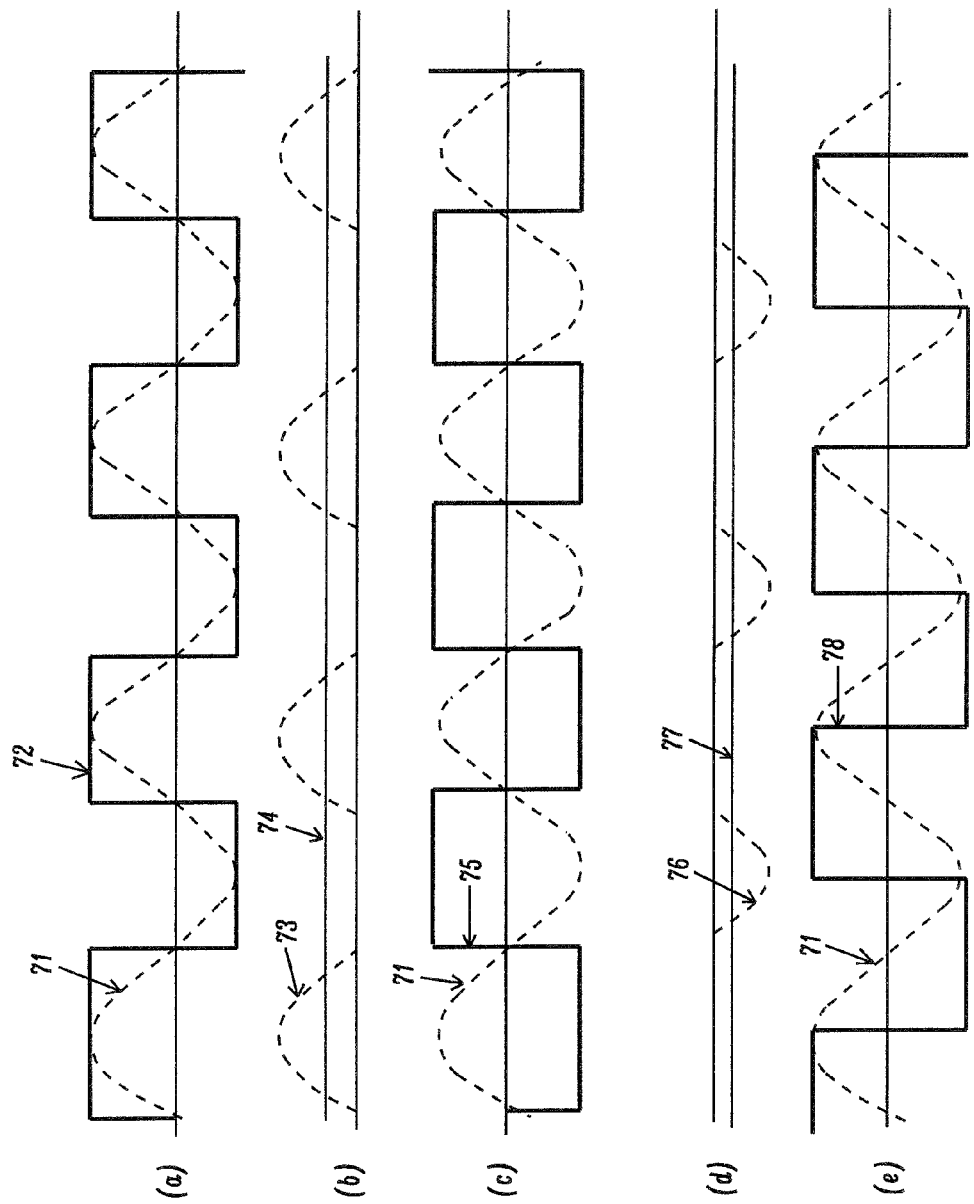
FIG. 2 schematically illustrates various signals involved when estimating a real part and an imaginary part of a complex impedance of a cable assembly.

Diagrams (a) and (b) of FIG. 2 illustrate exemplary, simplified signal patterns in the first branch of the impedance estimation unit 5. As can be seen in diagram (a), the response signal 71 indicated by a dashed line is in phase with a synchronization signal 72 which is indicated by a solid line. The illustrated exemplary response signal 71 may be detected at one end of a cable if the cable assembly solely comprises resistive components and no phase shift has occurred due to inductive or capacitive components. Diagram (b) depicts the output signal 73 of the first switching unit 51 as a dashed line. Since the exemplary first switching unit 51 is closed during times the synchronization signal 72 is in a high state, the negative half-waves of the response signal 71 are cut off in the output signal 73 of the first switching unit 51. After passing through the first low pass filter 53, the output signal 74, which is indicted by a solid line in diagram (b), represents a positive average value which is more or less constant over time.

Diagrams (c) and (d) in FIG. 2 illustrate exemplary, simplified signal patterns in a second branch of the impedance estimation unit 5. The second branch of the impedance estimation unit 5 comprises a second switching unit 52 and a second low pass filter 54, which comprises a second resistor 63 and a second capacitor 64. This time, however, an inverted synchronization signal 75 of the synchronization signal 72 is generated by an inverter 56 and applied at a control input of the second switching unit 52. In FIG. 2 (c), the inverted synchronization signal 75 is indicated by a solid line. Once again it is assumed that the response signal 71 did not undergo any phase shift and both signals illustrated in diagram (c) are in phase. As illustrated in diagram (d), the second switching unit 52 removes the negative half-waves of the sinusoidal-shaped response signal 71 and generates the output signal 76. Output signal 76 is then averaged and a nearly constant, negative average value 77 may be measured at the output of the second low pass filter 54.

In a last step, a difference determination unit 55 of the impedance estimation unit 5 determines the first quantity indicative of the real part of the complex impedance by computing a difference between the output signals 74 and 77 of the two branches. Although FIG. 1 shows the difference determination unit 55 with a "minus"-symbol at the first branch and a "plus"-symbol at the second branch, it is obvious for those skilled in the art that both symbols may be interchanged. In any case, the difference determination unit 55 computes a difference between the two average values provided by the two branches. The determined difference serves as an estimate for the real part of the complex impedance.

The second quantity indicative of an imaginary part of the complex impedance may be determined by the impedance estimation unit 5 by using a shifted synchronization signal 78. The latter signal is indicated by a solid line in diagram (e) of FIG. 2. The shifted synchronization signal may be generated by the synchronization signal generator 2 by shifting a phase of the synchronization signal by +90 degree or −90 degree. Alternatively, the impedance estimation unit 5 or some other unit of the apparatus may generate the shifted synchronization signal. As depicted in FIG. 1, the shifted synchronization signal is applied directly to the first branch and via inverter 56 to the second branch of the impedance estimation unit 5.

In diagram (e) of FIG. 2, it is still assumed that the response signal 71 is in phase with the test signal. As a result the second quantity determined by the difference determination unit 55 equals zero since both output signals of the two branches equal zero. Thus, for the chosen example, the imaginary part of impedance is zero due to missing capacitive or inductive components within the cable assembly.

The exemplary signals illustrated in FIG. 2 are considered helpful for understanding the present invention. Obviously, when a phase shift between the test signal and the response signal occurs, the output signals 74, 77 of the two branches may vary. For the special case of a response signal which is shifted by 90 degree with respect to the test signal, output signal 74 of the first branch may equal zero and output signal 77 of the second branch may have an average value different from zero representing the imaginary part of the complex impedance.

For detecting the response signal, filter unit 4 may comprise an analog or digital bandpass filter. Since the measurement of the complex impedance has to be performed while the electronic device is charged, a bandwidth from which the predetermined frequency of the test signal has to be selected is constrained. In particular, a regulation loop for regulating the output voltage of the power supply (such as e.g. a wall plug charger WPC) may be active and it may not be possible to use a DC measurement. In addition, noise may originate from load transients of the charger circuit of the electronic device.

Figure 3:
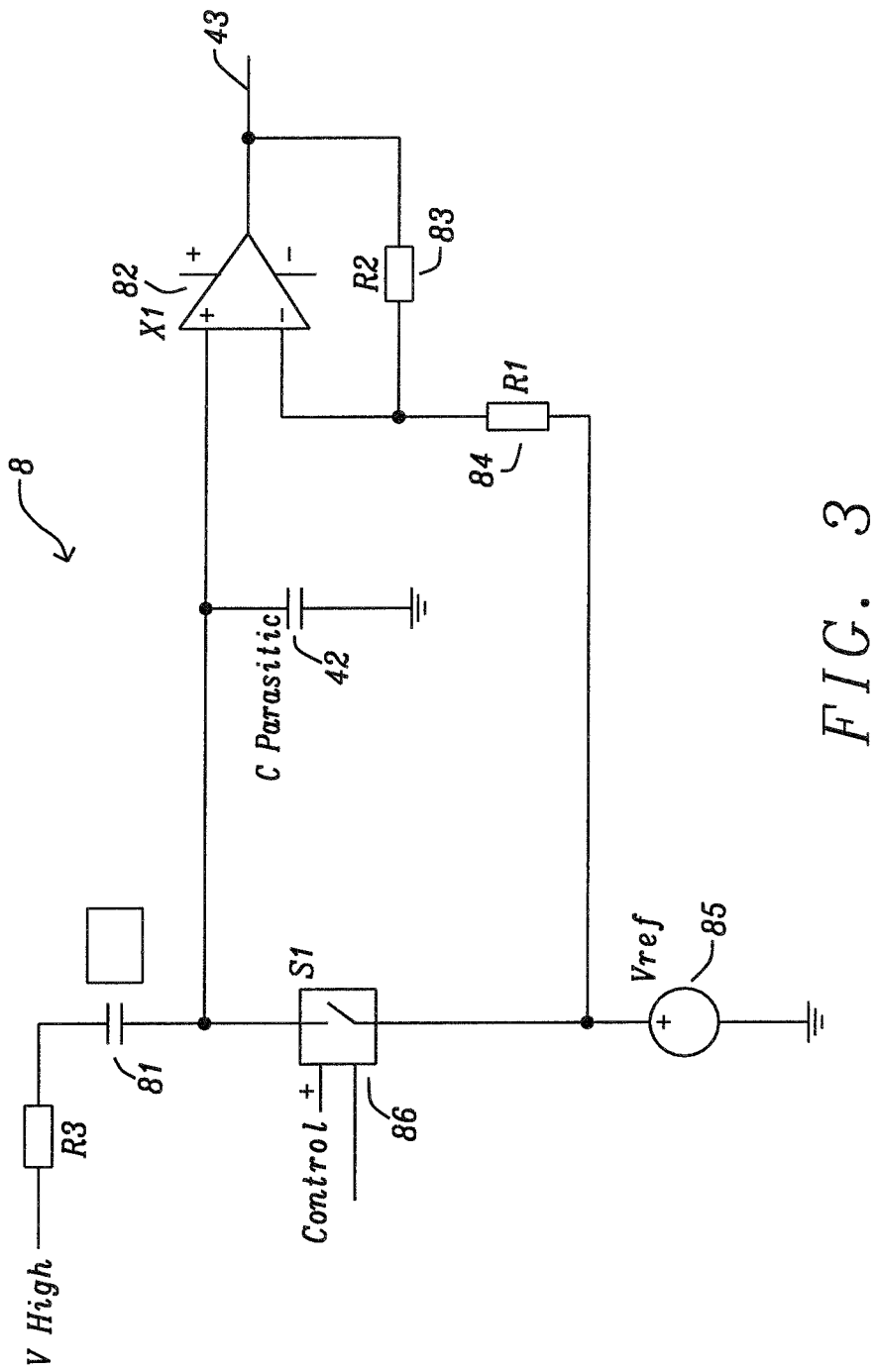
FIG. 3 is a schematic representation of an exemplary high pass filter.
Figure 4:
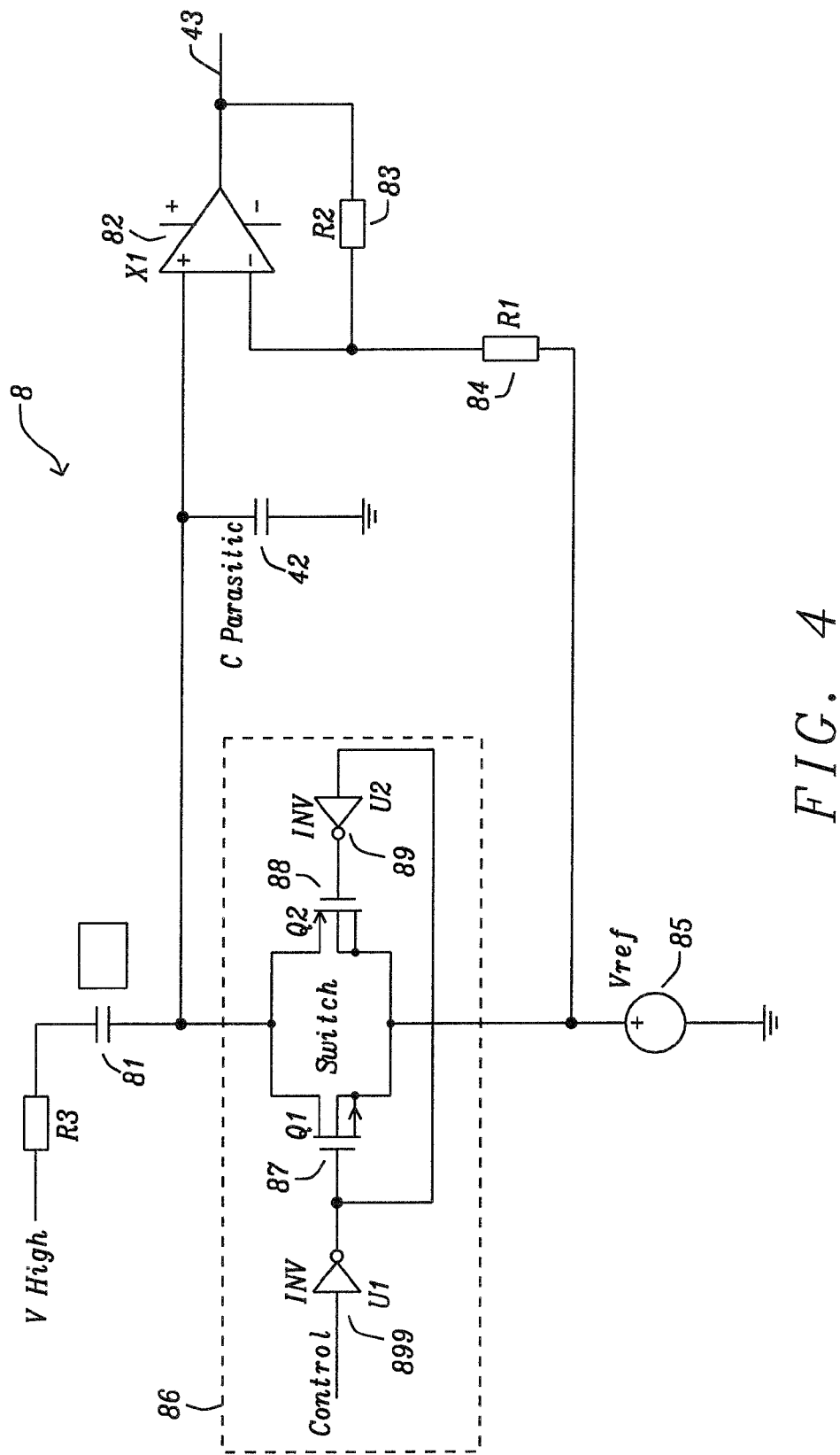
FIG. 4 is a schematic representation of another exemplary high pass filter.

FIGS. 3 and 4 illustrate schematic circuit implementations of an exemplary high pass filter 8 which may be used stand alone or in combination with a low pass filter to form a filter unit 4. At an input of the high pass filter 8, the response signal is applied. An input capacitor 81 is arranged in between the input of the high pass filter 8 and a non-inverting input of an operational amplifier 82. Optionally, the high pass filter 8 may comprise an additional input resistor which is denoted as R3 in FIG. 3. A feedback resistor 83 is arranged between the output of the high pass filter 8 and an inverting input of the operational amplifier 82. A second resistor 84 is arranged in between the inverting input of the operational amplifier 82 and a voltage source 85, providing a reference voltage. A switch 86 is controlled by the synchronization signal to connect or disconnect to the non-inverting input of the operational amplifier 82 to the voltage source 85. In FIGS. 3 and 4, an additional parasitic capacitor 42 is depicted at the non-inverting input of the operational amplifier 82.

The proposed high pass filter 8 represents an active high pass filter with a variable time constant. Across the input capacitor 81 the high voltage is blocked from the ground related system. The switch 82 serves as transmission gate to remove DC components from the response signal. Before starting a measurement at the impedance estimation unit 5, switch 86 is, triggered by the synchronization signal, shortly turned on and then off again.

FIG. 4 depicts an advantageous embodiment of switch 86 comprising an n-type and a p-type metal-oxide-semiconductor field-effect transistor MOSFET 87, 88. In the depicted example circuit, the source of the n-type MOSFET 88 is connected with the drain of the p-type MOSFET 87 and the non-inverting input of the operational amplifier 82. The drain of the n-type MOSFET 88 is connected with the source of the p-type MOSFET 87 and the voltage source 85. In the depicted example, an inverted version of the synchronization signal is applied to the gate of the n-type MOSFET 88. For this purpose, an inverter unit 89 is arranged at the input of the n-type MOSFET 88. An additional, optional inverter unit 899 is depicted in FIG. 4, too. In general, whether the inverted version of the synchronization signal is applied to the p-type MOSFET 87 or the n-type MOSFET 88 depends on the shape of the synchronization signal.

Figure 5:
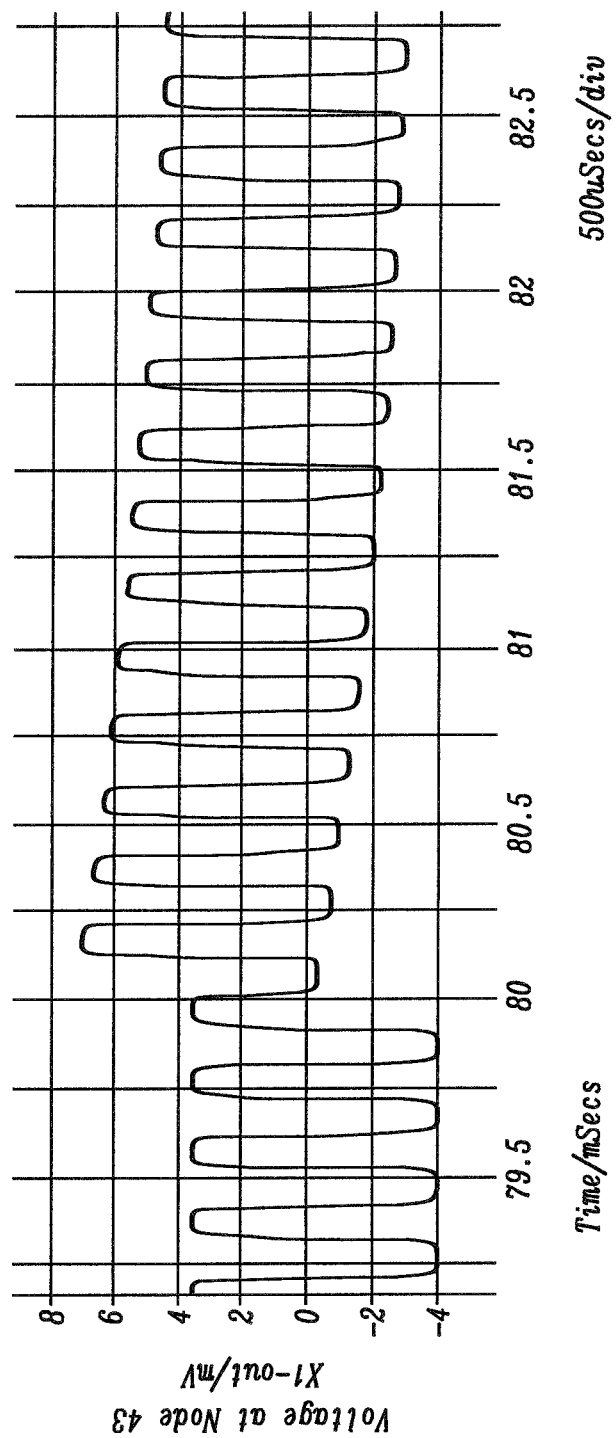
FIG. 5 shows an example diagram illustrating an output voltage of a filter unit.

Before starting a measurement, both MOSFETs 87, 88 are shortly turned on and then off again. FIG. 5 depicts the output voltage 43 of the operational amplifier 82 over time when a square wave test signal is used. As already mentioned, the test signal may have an arbitrary shape (e.g. a sinusoidal shape) as long as the test signal is a periodic signal synchronized with the synchronization signal at the predetermined frequency. Shortly after time 80 ms, a switching of the switch 86 occurs, resulting in a charge injection which generates an offset (up to 7 mV) of the response signal. However, the leakage of the MOSFETs will remove the offset and stabilize the oscillation between approximately +4 mV and −4 mV.

Figure 6:
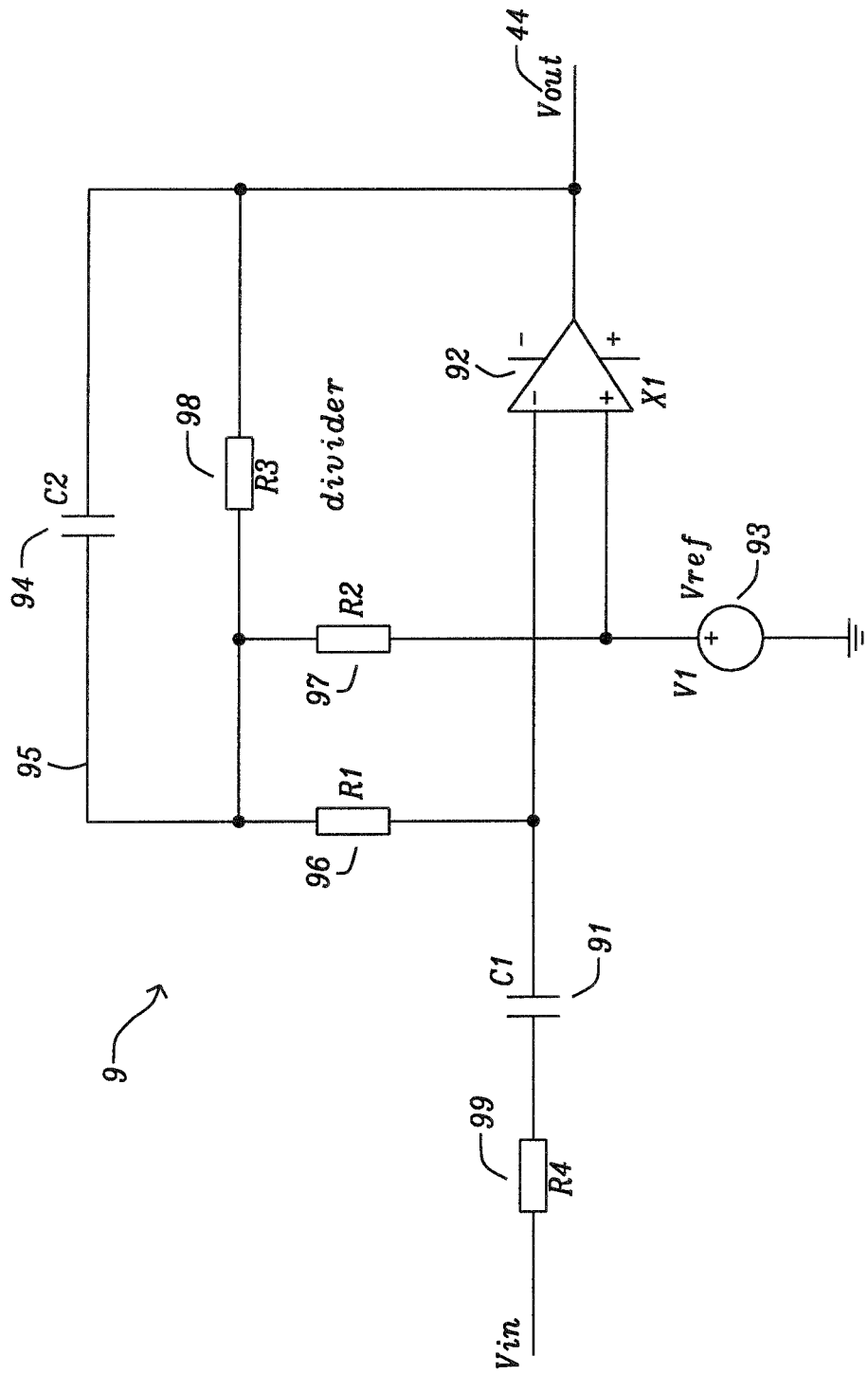
FIG. 6 is a schematic representation of an exemplary band pass filter.

FIG. 6 illustrates an exemplary band pass filter 9 which may be employed as filter unit 4. An input capacitor 91 is arranged between the input of the band pass filter 9 and the inverting input of an operational amplifier 92. The non-inverting input of the operational amplifier 92 is connected to a voltage source 93 at a reference voltage and the output of the operational amplifier 92 is connected to the output of the band pass filter 9. A feedback capacitor 94 is arranged between the output of the band pass filter 9 and an intermediate node 95. A first feedback resistor 96 is arranged between the inverting input of the operational amplifier 92 and the intermediate node 95, a second feedback resistor 97 is arranged between the non-inverting input of the operational amplifier 92 and the intermediate node 95, and a third feedback resistor 98 is arranged between the output of the band pass filter 9 and the intermediate node 95. Additionally, an optional input resistor R4 99 is depicted in FIG. 6.

Figure 7:
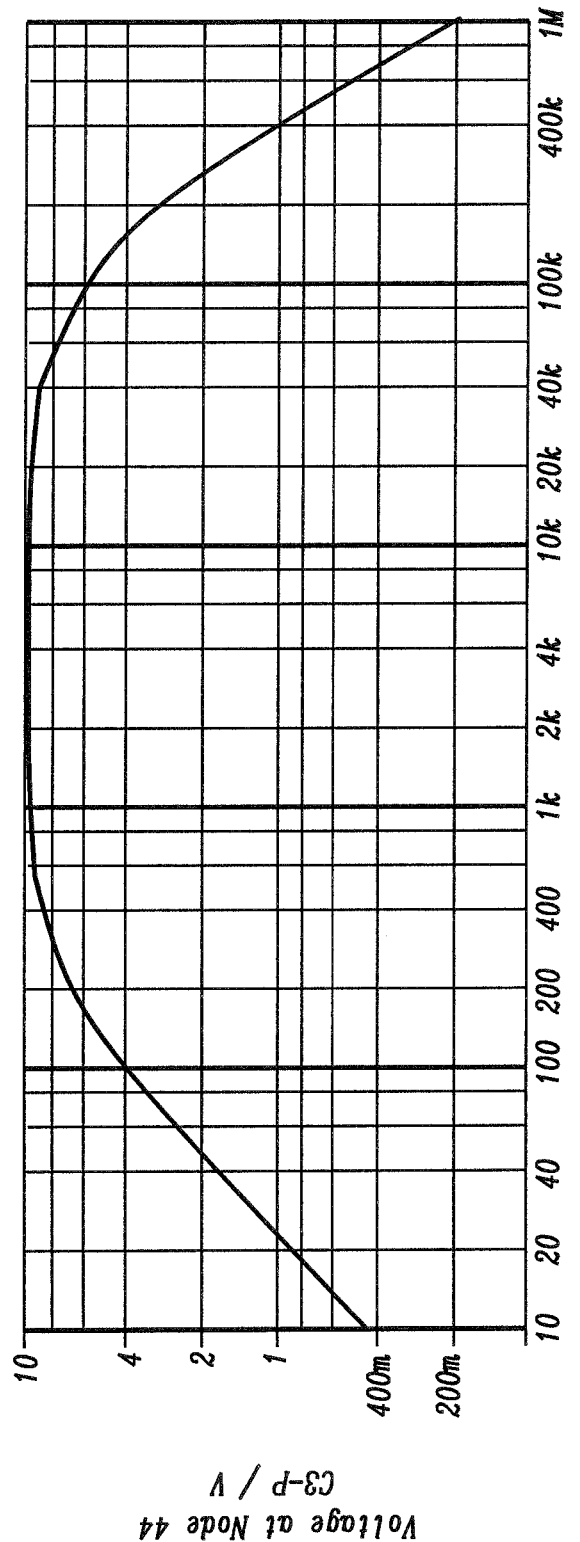
FIG. 7 shows a diagram of an output voltage of a band pass filter.

As already mentioned, the usage of a feedback resistor with high resistance is avoided by the T filter design comprising the three feedback resistors 96, 97, 98 with relatively low resistance values. The gain adjustment of the band pass filter is achieved by adapting the ratio of the capacitances of the input capacitor 91 and the feedback capacitor 94. FIG. 7 depicts a diagram showing an output voltage 44 of the band pass filter 9 for frequencies from 10 Hz to 1 MHz.

Figure 8:
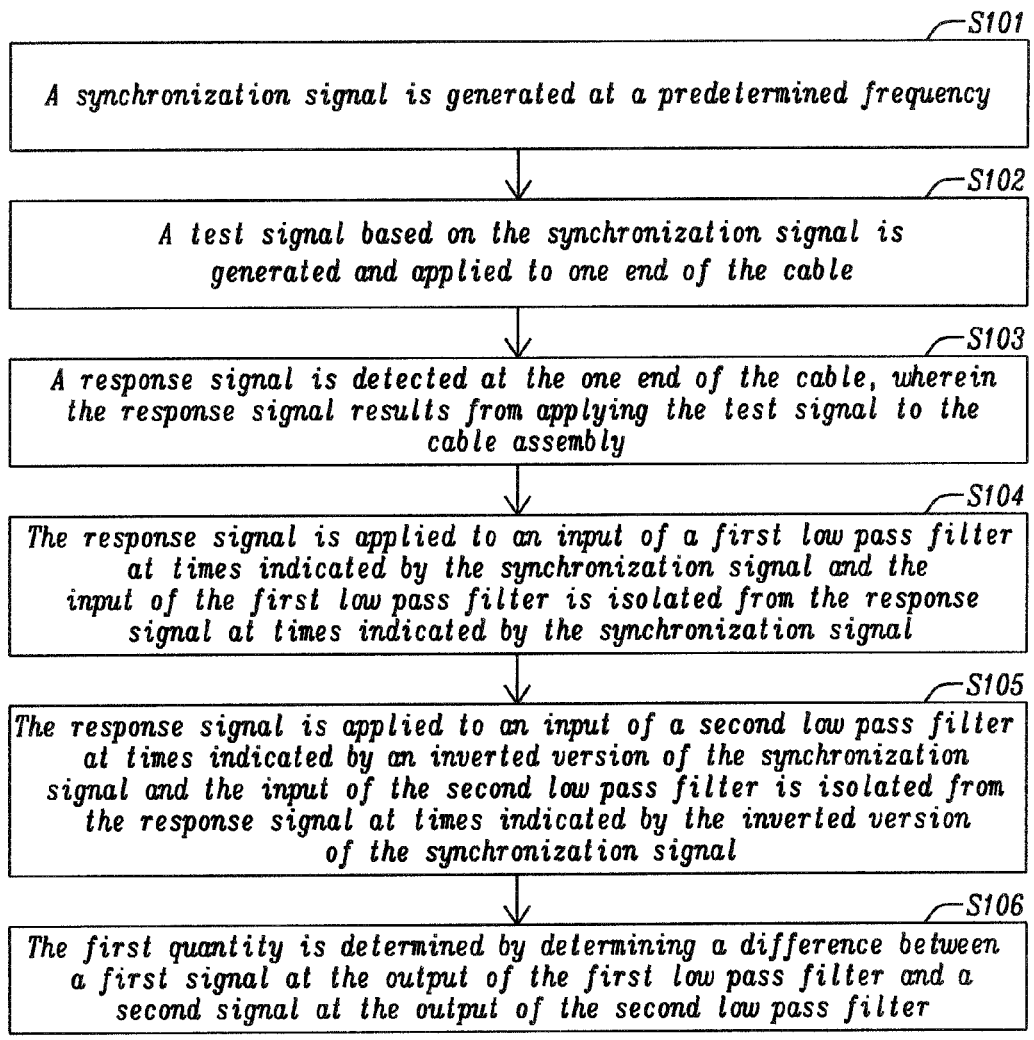
FIG. 8 is a flow-chart schematically illustrating a method for cable monitoring.

FIG. 8 shows a flow-chart schematically illustrating a method for determining a first quantity indicative of a real part of an impedance of a cable assembly.

At step S101, a synchronization signal is generated at a predetermined frequency. At step S102, a test signal based on the synchronization signal is generated and applied to one end of the cable. At step S103, a response signal is detected at one end of the cable, wherein the response signal results from applying the test signal to the cable assembly. At step S104, the response signal is applied to an input of a first low pass filter at times indicated by the synchronization signal and the input of the first low pass filter is isolated from the response signal at times indicated by the synchronization signal. At step S105, the response signal is applied to an input of a second low pass filter at times indicated by an inverted version of the synchronization signal and the input of the second low pass filter is isolated from the response signal at times indicated by the inverted version of the synchronization signal. At step S106, the first quantity is determined by determining a difference between a first signal at the output of the first low pass filter and a second signal at the output of the second low pass filter.

Figure 9:
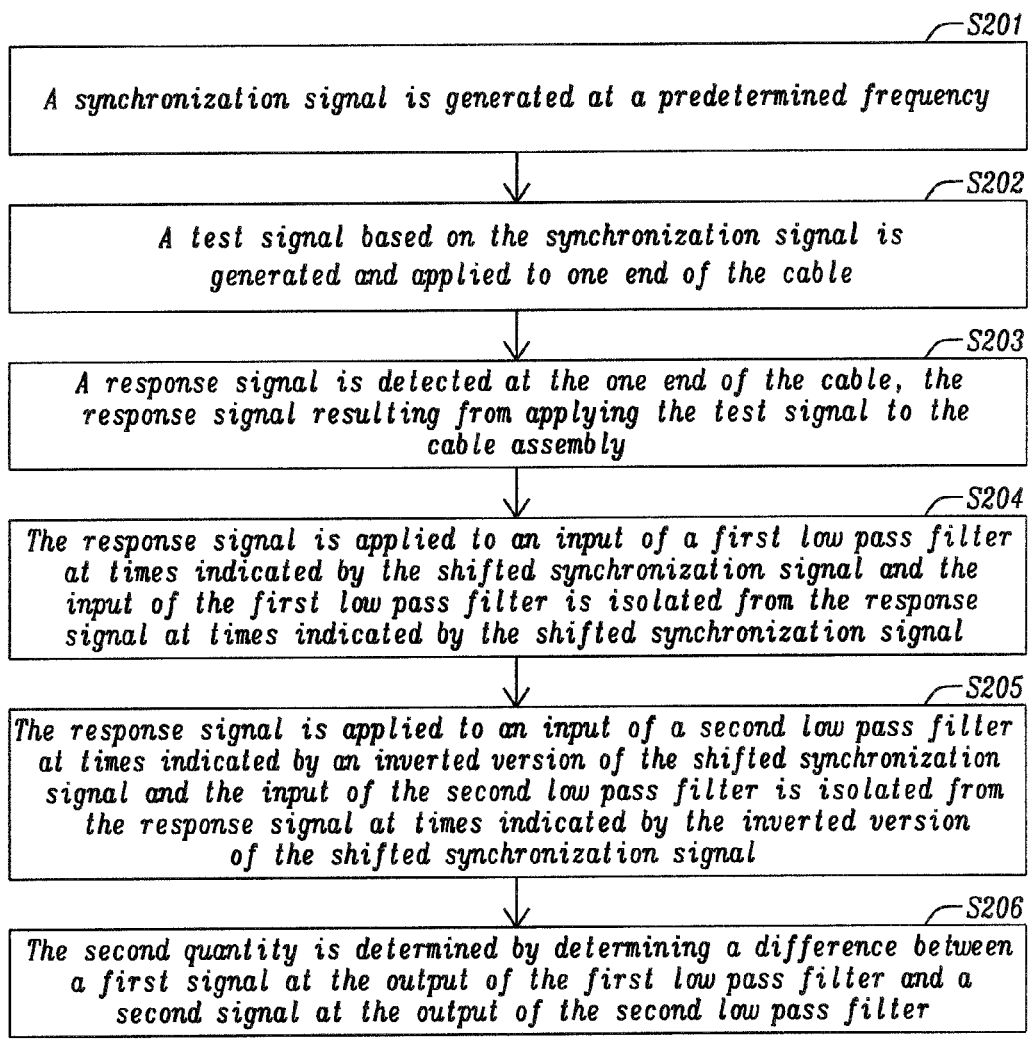
FIG. 9 is a flow-chart schematically illustrating another method for cable monitoring.

Finally, FIG. 9 shows a flow-chart schematically illustrating a method for determining a second quantity indicative of an imaginary part of an impedance of a cable assembly. At step S201, a synchronization signal is generated at a predetermined frequency. At step S202, a test signal based on the synchronization signal is generated and applied to one end of the cable. At step S203, a response signal is detected at the one end of the cable, the response signal resulting from applying the test signal to the cable assembly. At step S204, the response signal is applied to an input of a first low pass filter at times indicated by the shifted synchronization signal and the input of the first low pass filter is isolated from the response signal at times indicated by the shifted synchronization signal. At step S205, the response signal is applied to an input of a second low pass filter at times indicated by an inverted version of the shifted synchronization signal and the input of the second low pass filter is isolated from the response signal at times indicated by the inverted version of the shifted synchronization signal. At step S206, the second quantity is determined by determining a difference between a first signal at the output of the first low pass filter and a second signal at the output of the second low pass filter.

It should be noted that the apparatus features described above correspond to respective method features that may however not be explicitly described, for reasons of conciseness. The disclosure of the present document is considered to extend also to such method features. In particular, the present disclosure is understood to relate to methods of operating the circuits described above.

It should further be noted that the description and drawings merely illustrate the principles of the proposed apparatus. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. An apparatus for monitoring a process of powering an electronic device through a cable assembly, the cable assembly comprising a cable connected between a power supply and said electronic device, the apparatus comprising:
   a synchronization signal generator configured to generate a synchronization signal at a predetermined frequency;
   a test signal generator configured to generate, based on the synchronization signal, a test signal and to apply the test signal to one end of the cable;

a filter unit configured to detect a response signal at the one end of the cable, the response signal resulting from applying the test signal to the cable assembly; and an impedance estimation unit configured to determine, based on the response signal and based on the synchronization signal, a first quantity indicative of a real part of an impedance of the cable assembly and a second quantity indicative of an imaginary part of the impedance of the cable assembly, wherein the impedance estimation unit further comprises a first switching unit configured to apply, triggered by the synchronization signal, the response signal to an input of a first low pass filter; and a second switching unit configured to apply, triggered by an inverted version of the synchronization signal, the response signal to an input of a second low pass filter.

2. The apparatus according to claim 1, wherein the impedance estimation unit further comprises an inverter, the synchronization signal is applied to an input of the inverter, the output of the inverter is connected to a control input of the second switching unit, and the inverter is configured to invert the synchronization signal at its input and to output the inverted version of the synchronization signal.

3. The apparatus according to claim 1, wherein the impedance estimation unit further comprises a difference determination unit connected to an output of the first low pass filter and to an output of the second low pass filter, the difference determination unit configured to determine the first quantity by determining a difference between a first signal at the output of the first low pass filter and a second signal at the output of the second low pass filter.

4. The apparatus according to claim 1, wherein the apparatus is configured to generate a shifted synchronization signal by shifting a phase of the synchronization signal by 90 degree, the first switching unit is configured to apply, triggered by the shifted synchronization signal, the response signal to the input of the first low pass filter, the second switching unit is configured to apply, triggered by an inverted version of the shifted synchronization signal, the response signal to the input of the second low pass filter, and the difference determination unit is configured to determine the second quantity by determining a difference between a first signal at the output of the first low pass filter and a second signal at the output of the second low pass filter.

5. The apparatus according to claim 1, wherein the filter unit comprises a band pass filter configured to filter-out the response signal at the predetermined frequency.

6. The apparatus according to claim 1, wherein the filter unit comprises a band pass filter with an input capacitor arranged between an input of the band pass filter and an inverting input of an operational amplifier;

the operational amplifier, wherein a non-inverting input of the operational amplifier is connected to a reference voltage and an output of the operational amplifier is connected to an output of the band pass filter;

a feedback capacitor arranged between the output of the band pass filter and an intermediate node;

a first feedback resistor arranged between the inverting input of the operational amplifier and the intermediate node;

a second feedback resistor arranged between the non-inverting input of the operational amplifier and the intermediate node; and a third feedback resistor arranged between the output of the band pass filter and the intermediate node.

7. An apparatus for monitoring a process of powering an electronic device through a cable assembly, the cable assembly comprising a cable connected between a power supply and said electronic device, the apparatus comprising:

a synchronization signal generator configured to generate a synchronization signal at a predetermined frequency;

a test signal generator configured to generate, based on the synchronization signal, a test signal and to apply the test signal to one end of the cable;

a filter unit configured to detect a response signal at the one end of the cable, the response signal resulting from applying the test signal to the cable assembly, wherein the filter unit comprises a high pass filter with an input capacitor arranged in between an input of the high pass filter and a non-inverting input of an operational amplifier;

a feedback resistor arranged between the output of the high pass filter and an inverting input of the operational amplifier;

a second resistor arranged in between the inverting input of the operational amplifier and a reference voltage;

the operational amplifier, wherein an output of the operational amplifier is connected to the output of the high pass filter; and a switch configured to connect the non-inverting input of the operational amplifier with the reference voltage; and an impedance estimation unit configured to determine, based on the response signal and based on the synchronization signal, a first quantity indicative of a real part of an impedance of the cable assembly and a second quantity indicative of an imaginary part of the impedance of the cable assembly.

8. The apparatus according to claim 7, wherein the switch is configured to connect, triggered by the synchronization signal, the non-inverting input of the operational amplifier with the reference voltage.

9. The apparatus according to claim 7, wherein the switch comprises an n-type and a p-type metal-oxide-semiconductor field-effect transistor MOSFET, wherein a source of the n-type MOSFET is connected with a drain of the p-type MOSFET and a drain of the n-type MOSFET is connected with a source of the p-type MOSFET, and an inverted version of the synchronization signal is applied either to a gate of the p-type MOSFET or to a gate of the n-type MOSFET.

10. The apparatus according to claim 7, wherein the test signal is sinusoidal-shaped.

11. The apparatus according to claim 7, wherein the test signal is a time-dependent current variation and the response signal is a time-dependent voltage variation.

12. The apparatus according to claim 7, the apparatus being further configured to generate a signal for adjusting at least one of a current and/or voltage output of the power supply based on at least one of the determined first quantity and/or second quantity.

13. The apparatus according to claim 7, wherein the cable is a pluggable cable with standardized connectors.

14. A method of monitoring a process of powering an electronic device through a cable assembly, the cable assembly comprising a cable connected between a power supply and said electronic device, the method comprising:

generating a synchronization signal at a predetermined frequency using a synchronization signal generator;

generating a test signal based on the synchronization signal and applying the test signal to one end of the cable using a test signal generator;

detecting a response signal at the one end of the cable, the response signal resulting from applying the test signal to the cable assembly using a filter unit; and determining, based on the response signal and the synchronization signal, a first quantity indicative of a real part of an impedance of the cable assembly and a second quantity indicative of an imaginary part of the impedance of the cable assembly using an impedance estimation unit;

the method further comprising connecting the response signal to an input of a first low pass filter at times indicated by the synchronization signal and isolating the input of the first low pass filter from the response signal at times indicated by the synchronization signal;

connecting the response signal to an input of a second low pass filter at times indicated by an inverted version of the synchronization signal and isolating the input of the second low pass filter from the response signal at times indicated by the inverted version of the synchronization signal; and determining the first quantity by determining a difference between a first signal at the output of the first low pass filter and a second signal at the output of the second low pass filter.

15. The method according to claim 14, wherein the filter unit comprises a band pass filter filters out the response signal at the predetermined frequency.

16. The method according to claim 14, wherein the filter unit comprises a high pass filter with an input capacitor arranged in between an input of the high pass filter and a non-inverting input of an operational amplifier;

a feedback resistor arranged between the output of the high pass filter and an inverting input of the operational amplifier;

a second resistor arranged in between the inverting input of the operational amplifier and a reference voltage;

the operational amplifier, wherein an output of the operational amplifier is connected to the output of the high pass filter; and a switch connects the non-inverting input of the operational amplifier with the reference voltage.

17. The method according to claim 16, wherein the switch connects, triggered by the synchronization signal, the non-inverting input of the operational amplifier with the reference voltage.

18. The method according to claim 16, wherein the switch comprises an n-type and a p-type metal-oxide-semiconductor field-effect transistor MOSFET, wherein a source of the n-type MOSFET is connected with a drain of the p-type MOSFET and a drain of the n-type MOSFET is connected with a source of the p-type MOSFET, and an inverted version of the synchronization signal is applied either to a gate of the p-type MOSFET or to a gate of the n-type MOSFET.

19. The method according to claim 14, wherein the test signal is a time-dependent current variation and the response signal is a time-dependent voltage variation.

20. The method according to claim 14, wherein the cable is a pluggable cable with standardized connectors.

21. A method of monitoring a process of powering an electronic device through a cable assembly, the cable assembly comprising a cable connected between a power supply and said electronic device, the method comprising:

generating a synchronization signal at a predetermined frequency using a synchronization signal generator;

generating a test signal based on the synchronization signal and applying the test signal to one end of the cable using a test signal generator;

detecting a response signal at the one end of the cable, the response signal resulting from applying the test signal to the cable assembly using a filter unit; and determining, based on the response signal and the synchronization signal, a first quantity indicative of a real part of an impedance of the cable assembly and a second quantity indicative of an imaginary part of the impedance of the cable assembly using an impedance estimation unit;

the method further comprising generating a shifted synchronization signal by shifting a phase of the synchronization signal by 90 degree;

connecting the response signal to an input of a first low pass filter at times indicated by the shifted synchronization signal and isolating the input of the first low pass filter from the response signal at times indicated by the shifted synchronization signal;

connecting the response signal to an input of a second low pass filter at times indicated by an inverted version of the shifted synchronization signal and isolating the input of the second low pass filter from the response signal at times indicated by the inverted version of the shifted synchronization signal; and determining the second quantity by determining a difference between a first signal at the output of the first low pass filter and a second signal at the output of the second low pass filter.

22. The method according to claim 21, wherein the impedance estimation unit further comprises a first switching unit to apply, triggered by the synchronization signal, the response signal to an input of a first low pass filter; and a second switching unit to apply, triggered by an inverted version of the synchronization signal, the response signal to an input of a second low pass filter.

23. The method according to claim 22, wherein the impedance estimation unit further comprises an inverter, the synchronization signal is applied to an input of the inverter, the output of the inverter is connected to a control input of the second switching unit, and the inverter inverts the synchronization signal at its input and to output the inverted version of the synchronization signal.

24. The method according to claim 22, wherein the impedance estimation unit further comprises a difference determination unit connected to an output of the first low pass filter and to an output of the second low pass filter, the difference determination unit determines the first quantity by determining a difference between a first signal at the output of the first low pass filter and a second signal at the output of the second low pass filter.

25. The method according to claim 22, wherein the apparatus generates a shifted synchronization signal by shifting a phase of the synchronization signal by 90 degree, the first switching unit applies, triggered by the shifted synchronization signal, the response signal to the input of the first low pass filter, the second switching unit applies, triggered by an inverted version of the shifted synchronization signal, the response signal to the input of the second low pass filter, and the difference determination unit determines the second quantity by determining a difference between a first signal at the output of the first low pass filter and a second signal at the output of the second low pass filter.

26. The method according to claim 21, wherein the filter unit comprises a band pass filter with an input capacitor arranged between an input of the band pass filter and an inverting input of an operational amplifier;

the operational amplifier, wherein a non-inverting input of the operational amplifier is connected to a reference voltage and an output of the operational amplifier is connected to an output of the band pass filter;

a feedback capacitor arranged between the output of the band pass filter and an intermediate node;

a first feedback resistor arranged between the inverting input of the operational amplifier and the intermediate node;

a second feedback resistor arranged between the non-inverting input of the operational amplifier and the intermediate node; and a third feedback resistor arranged between the output of the band pass filter and the intermediate node.

27. The method according to claim 21, wherein the test signal is sinusoidal-shaped.

28. The method according to claim 21, the apparatus generates a signal for adjusting at least one of a current and voltage output of the power supply based on at least one of the determined first quantity and second quantity.

\* \* \* \* \*